(12) United States Patent
Staebler

(10) Patent No.: US 9,326,432 B2
(45) Date of Patent: Apr. 26, 2016

(54) DEVICE FOR PROTECTING A SPACE ADJACENT TO A MAGNETIC SOURCE, AND METHOD FOR MANUFACTURING SUCH A DEVICE

(75) Inventor: Patrick Staebler, Feucherolles (FR)

(73) Assignee: RENAULT s.a.s., Boulogne Billancourt (FR)

( * ) Notice: Subject to any disclaimer, the term of this patent is extended or adjusted under 35 U.S.C. 154(b) by 0 days.

(21) Appl. No.: 14/128,331

(22) PCT Filed: Jun. 14, 2012

(86) PCT No.: PCT/FR2012/051328
§ 371 (c)(1),
(2), (4) Date: Jan. 14, 2014

(87) PCT Pub. No.: WO2012/175846
PCT Pub. Date: Dec. 27, 2012

(65) Prior Publication Data
US 2014/0131087 A1    May 15, 2014

(30) Foreign Application Priority Data
Jun. 20, 2011    (FR) ...................................... 11 55411

(51) Int. Cl.
*H01F 5/00*    (2006.01)
*H05K 9/00*    (2006.01)

(52) U.S. Cl.
CPC ............ *H05K 9/0075* (2013.01); *H05K 9/0001* (2013.01); *Y10T 29/49117* (2015.01)

(58) Field of Classification Search
CPC .. H05K 9/0077; H05K 9/0075; H05K 9/0088
USPC ........................................................ 335/301
See application file for complete search history.

(56) References Cited

U.S. PATENT DOCUMENTS

| | | | |
|---|---|---|---|
| 3,212,865 A * | 10/1965 | Miller ........................... | 428/607 |
| 3,555,169 A * | 1/1971 | Miller ........................... | 428/677 |
| 4,890,083 A * | 12/1989 | Trenkler et al. ................ | 335/301 |
| 5,315,245 A * | 5/1994 | Schroeder et al. ........ | 324/207.21 |
| 5,603,196 A * | 2/1997 | Sohlstrom .................... | 52/796.1 |

(Continued)

FOREIGN PATENT DOCUMENTS

| DE | 10 2009 0396000 | 3/2011 |
|---|---|---|
| EP | 0 720 421 | 7/1996 |
| JP | 2002 291113 | 10/2002 |

OTHER PUBLICATIONS

International Search Report Issued Aug. 31, 2012 in PCT/FR12/051328 Filed Jun. 14, 2012.

(Continued)

*Primary Examiner* — Shawki S Ismail
*Assistant Examiner* — Lisa Homza
(74) *Attorney, Agent, or Firm* — Oblon, McClelland, Maier & Neustadt, L.L.P.

(57) ABSTRACT

To protect a space adjacent to a magnetic source from magnetic energy radiated by the source, a device includes one or two sheets of ferromagnetic material. Each sheet extends between the space and the source. The device further includes one or two sheets of a diamagnetic or paramagnetic electrically-conductive material, one of which extends between the sheet and the space being protected, and the other additional sheet extending between the sheet of ferromagnetic material and the magnetic source.

12 Claims, 3 Drawing Sheets

(56) References Cited

U.S. PATENT DOCUMENTS

| | | | |
|---|---|---|---|
| 6,282,848 B1 * | 9/2001 | Schlapfer | 52/79.1 |
| 6,731,968 B2 * | 5/2004 | Buchanan | 600/409 |
| 7,612,553 B2 * | 11/2009 | Kinzel | 324/117 H |
| 2004/0000415 A1 * | 1/2004 | Rizzo et al. | 174/35 R |
| 2005/0162249 A1 * | 7/2005 | Simola | 335/301 |

OTHER PUBLICATIONS

French Search Report Issued Feb. 21, 2012 in FR 1155411 Filed Jun. 20, 2011.

* cited by examiner

DEVICE FOR PROTECTING A SPACE ADJACENT TO A MAGNETIC SOURCE, AND METHOD FOR MANUFACTURING SUCH A DEVICE

BACKGROUND

The invention relates to a device which allows a space adjacent to a magnetic source to be protected.

The magnetic energy radiated into a space adjacent to a magnetic source can disrupt the operation of electronic devices (electromagnetic compatibility) and/or present a danger for a human being who occupies this space when this energy results from a high power even over a short duration or from a weaker power to which the human being is, however, exposed over a longer period of time.

Generally, such a device comprises a multilayer shield or screen, such as, for example, that described in document EP1399929. The shield disclosed by this document is wound around an electric cable. It comprises at least two layers of ferromagnetic material.

This method of shielding is not appropriate when the magnetic source has a more complex shape than a simple straight tubular shape. This can be the case when the magnetic source is not limited to the cable itself but also includes connection terminals or various power electronic equipment. This can be the case also for a cable per se when it is subjected to certain bending in static mode in the path from one piece of electrical equipment to another or in dynamic mode when the cables are connected to mobile equipment. This bending can cause rupturing in the layers of ferromagnetic material, which then no longer allows the magnetic field lines to be correctly channeled and which then makes the shield lose the magnetic screen qualities thereof.

To overcome the problems of the prior art, the object of the invention is a device for protecting a space adjacent to a magnetic source against magnetic energy radiated by said source, comprising a first sheet of ferromagnetic material, which sheet is spread between said space and said source. The device is characterized in that it includes a first sheet of diamagnetic or paramagnetic electrically conductive material, which sheet is spread between said first sheet of ferromagnetic material and said space to be protected.

Particularly, the device comprises a second sheet of diamagnetic or paramagnetic electrically conductive material, which sheet is spread between said first sheet of ferromagnetic material and said magnetic source.

More particularly, the device comprises a second sheet of ferromagnetic material, which sheet is spread between said first sheet of ferromagnetic material and said first sheet of electrically conductive material.

Advantageously, said sheet(s) of electrically conductive material has(have) a surface area which is greater than that of the sheet(s) of ferromagnetic material such as to completely cover said sheet(s) of ferromagnetic material.

Preferably, the ferromagnetic material has a relative magnetic permeability with a high value greater than 100000.

In particular, the ferromagnetic material is an iron-based amorphous alloy having a non-orientated nanocrystalline structure.

More particularly, said alloy comprises a chemical element of a group comprising cobalt and nickel.

BRIEF SUMMARY

More particularly again, at least one sheet of ferromagnetic material is covered with at least one layer of electrically insulating material.

Also preferably, the diamagnetic or paramagnetic electrically conductive material comprises aluminum.

Another object of the invention is a method of manufacturing a device for protecting a space adjacent to a magnetic source against magnetic energy radiated by said source. The method is characterized in that it comprises steps of:

shaping a first sheet of diamagnetic or paramagnetic electrically conductive material in order to be able to spread the sheet with a first face opposite said space to be protected;

spreading one or more sheets of ferromagnetic material over a second face of said first sheet of diamagnetic or paramagnetic electrically conductive material, which is opposite said first face of said first sheet of electrically conductive material.

Particularly, the manufacturing method further comprises steps of:

shaping a second sheet of diamagnetic or paramagnetic electrically conductive material in order to be able to spread the sheet with a first face opposite the magnetic source;

positioning said second sheet of electrically conductive material such that the sheet(s) of ferromagnetic material is(are) spread over a second face of said second sheet of electrically conductive material, which is opposite said first face of said second sheet of electrically conductive material.

The invention especially covers a mobile object comprising at least one electric member which is a source of magnetic radiation. The mobile object is characterized in that it comprises a device according to the invention such as to provide a low-mass protection against magnetic energy radiated by said source.

Particularly, the mobile object covered by the invention is a motor vehicle comprising a compartment which includes a space adjacent to said member. Advantageously, the device in accordance with the invention is placed in the motor vehicle between the member and the compartment.

The invention is particularly advantageous for any use where lightness, in other words the saving in mass, is important, for example all vehicles (aircraft, trains, etc.), portable systems or other mobile objects.

BRIEF DESCRIPTION OF THE DRAWINGS

The invention will be better understood using embodiments of a device in accordance with the invention with reference to the appended drawings, wherein.

DETAILED DESCRIPTION

Figure 1:
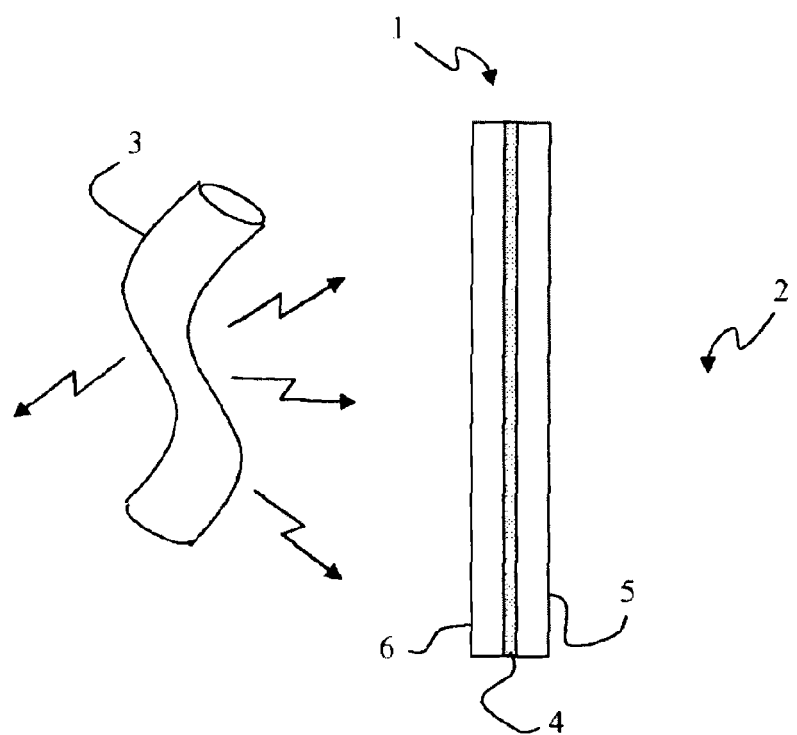
FIG. 1 is a schematic view of a device in accordance with the invention.

FIG. 1 shows a device 1 for protecting a space 2 adjacent to a magnetic source 3 against magnetic energy radiated by the source 3.

Such a device is necessary in many fields in order to protect a human being against the magnetic energy radiated by apparatuses which are, moreover, useful therefor.

Figure 4:
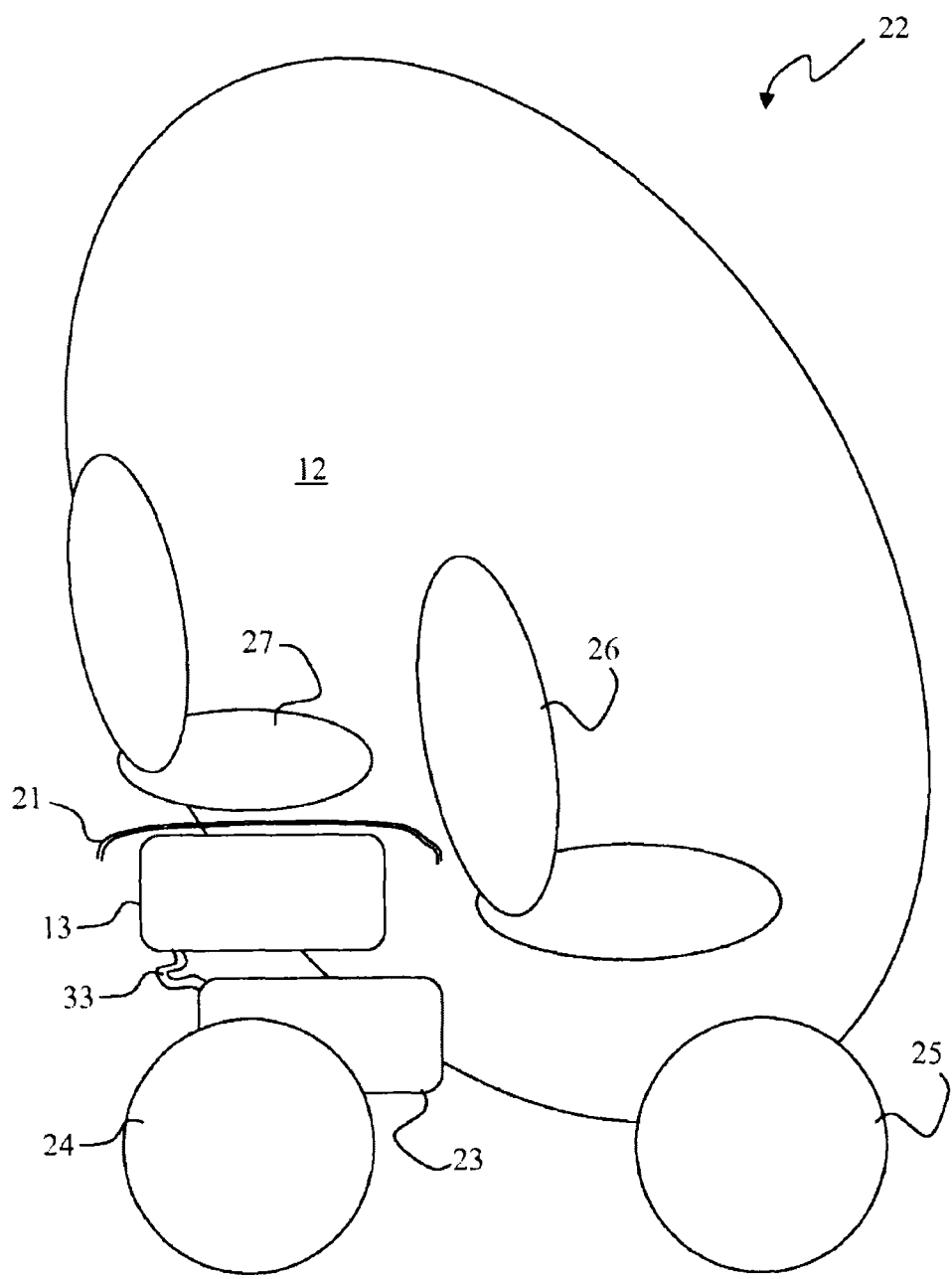
FIG. 4 is a schematic view of a motor vehicle in accordance with the invention.

In particular, the vehicle 22 shown in FIG. 4 comprises wheels 24, 25 and a machine 23 for driving all or some of these wheels. The machine 23 is controlled by an electric power supply 13.

When the machine 23 is a thermal engine, the electric power supply 13, of a first type, generates, for example, ignition sequences in the case of petrol combustion and/or sequences for controlling injectors in the case of petrol or diesel combustion.

When the machine 23 is an electric machine, the electric power supply 13, of a second type, particularly generates the electric current which makes the machine 23 operate as an engine or a generator according to the positive or negative direction of the current. The electric power supply 13 then groups together a battery and power electronics.

The electric power supply 13 and particularly the cable(s) 33 which connects(connect) the electric power supply to the machine 23 are members which form a source of static or, particularly when the current varies, radiated magnetic field.

Other elements in a motor vehicle or in other environments can also form a source 3 of static or radiated magnetic field.

The vehicle 22 comprises a compartment provided with seats 26, 27 for accommodating a driver and at least one passenger, respectively. In order to reduce as much as possible the bulkiness of the vehicle shown in this case, the seat 27 is placed above the members 13, 23, 33. The part of the compartment occupied by the seat 27 therefore includes a space 12 adjacent to the magnetic source. The space 12 requires a device 21 which forms a screen against the magnetic radiation such as to not expose the passenger to magnetic fields which can be detrimental to the health thereof.

Other spaces can require protection to prevent exposure of the persons to magnetic fields, for example, by way of pure illustration and without limitation, adjacent to electric transforming stations or strong current electric distribution lines in a factory.

Generally, the device 1 of FIG. 1 comprises a sheet 4 of ferromagnetic material, which sheet is spread between the space 2 and the magnetic source 3.

Attempts have been made to achieve the best possible performance for reducing magnetic field adjacent to the source at the best cost, while keeping in mind the requirement to limit the weight of the device 1. Indeed, lightness is a requirement of fundamental importance in many engineering achievements, particularly in motor vehicles.

It is noted that Ampere's law states, in a known manner, in a steady or almost steady state, a link of proportionality between the circulation of the magnetic B-field on a closed curve and the electric current passing through the surface defined by this closed curve.

It is known that, in a vacuum, the proportionality factor is equal to the magnetic permeability of the vacuum $\mu_0$ which is $4\Pi \times 10^{-7}$ Tm/A. The magnetic permeability $\mu$ of a medium different to a vacuum is obtained by multiplying the permeability of the vacuum by a proportionality factor $\mu_r$ called relative permeability which characterizes the medium.

In a dynamic state, Ampere-Maxwell law states the relationship between the magnetic field and the electric current involving the electric field time variations.

The knowledge stated above has been used to vary an electric current in the source 3 such as to obtain a magnetic field generated by the magnetic source, at frequencies which describe a spectrum varying from a few Hz to several MHz.

By recording the accumulated radiated magnetic energy over a range of frequencies which are less than a given threshold, a dramatic increase in accumulated radiated energy was observed for a threshold value of between 10 and 100 Hz, and then a more progressive increase for threshold values of between 100 Hz and 1000 Hz. The accumulated magnetic energy then increases weakly while tending towards an asymptotic value for threshold values of between 1000 Hz and 10 MHz.

In view of this observation, attempts have been made to configure the device 1 such as to attenuate as far as possible the magnetic fields in a range of frequencies varying from 10 Hz to 1 kHz, even up to 10 kHz.

In these bands of frequencies, the materials which are best suited to form a screen against magnetic fields are ferromagnetic materials a priori.

If it is known that paramagnetic electrically conductive materials such as aluminum allow magnetic fields to be attenuated considerably at high frequencies, they are not suitable for forming a screen against magnetic fields at low frequency. While an aluminum plate with limited dimensions and a thickness of 1 mm has allowed an attenuation of −58 dB to be achieved in a frequency band between 100 kHz and 2 MHz, this same plate has only allowed an attenuation limited to merely −2 dB for frequencies less than 100 Hz and to merely −7 dB for frequencies close to 400 Hz.

For the ferromagnetic material, a ferromagnetic material was sought which possesses a relative magnetic permeability $\mu_r$ with a high value, in other words greater than 100000 such as to achieve good effectiveness at low frequencies.

This is, for example, the case of mu-metal made up of substantially 77-80% nickel, and substantially 15% iron with copper and/or molybdenum making up the remainder. A feature of this material is a relative permeability in the region of 150000 which promotes deviation of the magnetic field lines at low frequency and a Curie temperature of approximately 420° C. which is extremely suitable for hot environments as may be encountered adjacent to an engine.

By increasing the frequency from 10 Hz to 10 MHz, firstly the magnetic field between the source 3 and the device 1 was measured and secondly the magnetic field in the space 2 beyond the device 1 was measured at fixed points on either side of the device 1 in order to be able to compare the measurements. For each frequency, the ratio between the two measurements gives an attenuation brought about by the screen device.

A sheet of mu-metal allows a substantially constant attenuation to be achieved, which varies alternately slightly about −7.5 dB in the range of frequencies from 10 Hz to 1000 Hz, decreases to substantially −17 dB in the range from 1 to 4 kHz, then remains substantially constant about the latter value beyond 4 kHz. These values also depend on the size of the sheet.

The possibilities of using an iron-based amorphous alloy with a non-orientated nanocrystalline structure as ferromagnetic material has also been studied with a view to increasing the attenuation performance. To distinguish this class from that of mu-metal, the materials that belong thereto will be designated in the rest of the description by the acronym FMNA (ferromagnetic nanocrystalline amorphous).

In this class of materials, the NANOPERM™ is an iron-based alloy comprising silicon and made of small quantities of copper, niobium and boron. It allows a magnetic permeability of 200000 to be achieved depending on the supplier thereof. The supplier specification indicates a magnetostriction coefficient less than 0.5 ppm.

In this class of materials, the FINEMET™ is an iron-based alloy which also comprises a chemical element of a group comprising silicon. The supplier specification indicates a relative magnetic permeability $\mu_r$ of approximately 70000 and an extremely low magnetostriction coefficient of approximately $10^{-7}$. This low magnetostriction coefficient is beneficial in the attempt to reduce the noise generated by the magnetic fields oscillating in the audible frequency bands.

A FINEMET™ sheet is a ferromagnetic material sheet covered on each of the faces thereof by a layer of electrically insulating material.

Each layer of electrically insulating material includes a PET (polyethylene terephthalate) film to a thickness of 25 µm, which film is connected to the sheet of ferromagnetic material by a layer of adhesive material with a thickness of 25 µm. Since the thickness, itself, of the ferromagnetic material is 18 µm, a sheet of FMNA material with a 0.12 mm thickness is therefore obtained.

By repeating the same experiment as with the mu-metal, a sheet of FMNA material with a 0.12 mm thickness has allowed a substantially constant attenuation to be achieved, which varies alternately slightly about −2 dB in the range of frequencies from 10 Hz to 1000 Hz, progresses to substantially −14 dB in the range from 1 to 5 kHz, then remains substantially constant about the latter value beyond 5 kHz.

A stack of two sheets of FMNA material with a 0.12 mm thickness has allowed a substantially constant attenuation to be achieved, which varies alternately slightly about −4 dB in the range of frequencies from 10 Hz to 1000 Hz, progresses to substantially −15 dB in the range from 1 to 3 kHz, then remains substantially constant about the latter value beyond 3 kHz. It is noted that doubling the number of the sheets brings about a purely proportional performance improvement at low frequencies and almost no improvement at high frequencies.

A stack of three sheets of FMNA material with a 0.12 mm thickness has allowed a substantially constant attenuation to be achieved, which varies alternately slightly about −6 dB in the range of frequencies from 10 Hz to 1000 Hz, reaches substantially −10 dB in the range from 1 to 2 kHz, then remains substantially constant about the latter value beyond 2 kHz. It is noted that tripling the number of the sheets brings about a small improvement in performance at low frequencies and a deterioration at high frequencies.

In order to overcome the deterioration in performance at high frequencies, a sheet of aluminum was spread between the source and the sheet(s) of ferromagnetic material. The sheet of electrically conductive material, which eliminates or, at the least, greatly reduces the high-frequency components of the magnetic field, eases the screen function to be fulfilled by the ferromagnetic material by mainly only transmitting thereto the low-frequency components of the magnetic field.

By spreading a sheet of aluminum with a 1 mm thickness between the source 3 and a sheet of FMNA material with a 0.12 mm thickness, an attenuation is achieved which progresses from −3 dB to −17 dB in the range of frequencies from 10 Hz to 1000 Hz, then remains substantially constant about −25 dB beyond 2 kHz. It is noted that spreading a sheet of paramagnetic electrically conductive material brings about an improvement in performance at high frequencies, and which is already notable at relatively low frequencies from 700 Hz where an attenuation of −15 dB is achieved.

By spreading the sheet of aluminum with a 1 mm thickness between the source 3 and two sheets of FMNA material with a 0.12 mm thickness, an attenuation is achieved which progresses from −4 dB to −18 dB in the range of frequencies from 10 Hz to 1000 Hz, then remains substantially constant about −30 dB beyond 3 kHz. It is noted that spreading the sheet of paramagnetic electrically conductive material between the source 3 and two sheets of ferromagnetic material brings about a small improvement in performance compared to spreading the sheet of aluminum between the source 3 and a single sheet of FMNA material.

In a surprising manner, by spreading the sheet of aluminum with a 1 mm thickness over the face of the sheet of FMNA material with a 0.12 mm thickness, which is opposite the face facing the source 3, an attenuation is achieved which progresses from −3 dB to −22 dB in the range of frequencies from 100 Hz to 1000 Hz, then remains substantially constant about −25 dB beyond 2 kHz. It is noted that spreading a sheet of paramagnetic electrically conductive material behind the sheet of ferromagnetic material in relation to the source 3 brings about an improvement in performance at low frequencies which is clearly greater than that obtained with the two preceding experiments above. This configuration allows greater performance to be achieved with a single sheet of FMNA material than that obtained with two sheets of FMNA material in the opposite configuration. Since all parameters are, moreover, equal, attenuation increases when the thickness of the sheet(sheets) of aluminum increases(increase).

This result is not obvious, a priori, since in the latter configuration, submitting the sheet of ferromagnetic material to the entire magnetic field prior to propagation towards the sheet of paramagnetic material should tend to promote the saturation phenomena in the ferromagnetic material.

This result is advantageous since it increases performance while cutting in half the costs effected by those of the sheets of FMNA material, the latter being relatively high.

By spreading the sheet of aluminum with a 1 mm thickness over two sheets of FMNA material with a 0.12 mm thickness opposite the source 3, an attenuation is achieved which progresses from −8 dB to −22 dB in the range of frequencies from 10 Hz to 1000 Hz, then remains substantially constant about −30 dB beyond 3 kHz. It is noted that spreading the sheet of paramagnetic electrically conductive material over two sheets of ferromagnetic material opposite the source 3 brings about almost no improvement in performance compared to spreading the sheet of aluminum over a single sheet of FMNA material.

A first optimum is therefore obtained in terms of effectiveness and cost by spreading one sheet of non-ferromagnetic electrically conductive material over the face of a single sheet of ferromagnetic material, which is opposite the face facing the magnetic source.

In the device of FIG. 1, a sheet 5 of diamagnetic or paramagnetic electrically conductive material is advantageously spread between the sheet 4 and the space to be protected 2.

Nevertheless, attempts have been made to find other ways to further improve performance.

Again in a surprising manner, by spreading a second sheet of aluminum with a 1 mm thickness over the other face of a single sheet of FMNA material with a 0.12 mm thickness, an attenuation is achieved which progresses from −5 dB to −35 dB in the range of frequencies from 100 Hz to 600 Hz, then progresses more gradually to reach −37 dB at 1000 Hz, then remains substantially constant about −37 dB beyond 1 kHz. It is noted that spreading a sheet of paramagnetic electrically conductive material on either side of the sheet of ferromagnetic material in relation to the source 3 brings about an improvement in performance at low frequencies which is clearly greater than the sum of those achieved with the preceding experiments which use a sheet of non-ferromagnetic electrically conductive material, which sheet is combined with a sheet of ferromagnetic material. This configuration allows greater performance than that achieved with the preceding experiments to be achieved with a single sheet of FMNA material. In this case again, it is noted that, with all of the parameters being moreover equal, the attenuation increases when the thickness of the sheet of aluminum increases.

This result is not obvious, a priori, since, in the latter configuration, the technical effect of a screen against the magnetic fields, which is brought about by the combination of the sheets as is seen, is considerably greater than the sum of the effects brought about by each of the sheets and even the sum of the combinations of sheets in pairs.

Of course, adding an additional non-ferromagnetic metal sheet can have implications for cost and weight, the latter being an important choice factor, particularly for a mobile use. Depending on the admissible intensity of radiated magnetic energy, a single sheet of non-ferromagnetic electrically conductive material can be acceptable, which sheet is stacked on the face of a sheet of ferromagnetic material on the side of the space to be protected.

However, when the intensity of the magnetic fields justifies a slight increase in cost and weight, given that aluminum is a relatively light metal compared to some others and costs clearly less than that of the sheets of materials combining a strong magnetic permeability, a high magnetic saturation threshold level and low magnetostriction as is the case of FINEMET™, the invention teaches a distinct preference for the use of two sheets of non-ferromagnetic metal, more precisely of paramagnetic metal.

Therefore, the device 1 of FIG. 1 comprises a second sheet 6 of diamagnetic or paramagnetic electrically conductive material, which sheet is spread between the sheet 4 of ferromagnetic material and the magnetic source 3.

It emerges from the tests disclosed above that increasing the number of sheets of ferromagnetic material brings little gain in performance.

Nevertheless, tests have been carried out by inserting several sheets of ferromagnetic material between two sheets of non-ferromagnetic material.

A stack of two sheets of FINEMET™ with a 0.12 mm thickness between two sheets of aluminum with a 1 mm thickness has allowed an attenuation to be achieved which progresses with a steep gradient from −7 dB for a frequency of 50 Hz up to −35 dB for a frequency of 350 Hz, progresses again however with a slight gradient up to substantially −37 dB at 1 kHz, then remains substantially constant about −36 dB beyond 5 kHz. Unlike the preceding tests, it is noted that doubling the number of sheets brings about a notable performance improvement at low frequencies and a slight tendency to reverse at high frequencies.

A stack of three sheets of FINEMET™ with a 0.12 mm thickness between two sheets of aluminum with a 1 mm thickness has allowed an attenuation to be achieved which progresses again with an almost identical steep gradient from −10 dB for a frequency of 50 Hz up to −35 dB for a frequency of 400 Hz, then remains substantially constant about −33 dB beyond 1 kHz. It is noted that doubling the number of the sheets brings about a notable performance improvement at low frequencies and a slight tendency to reverse at high frequencies.

Figure 2:
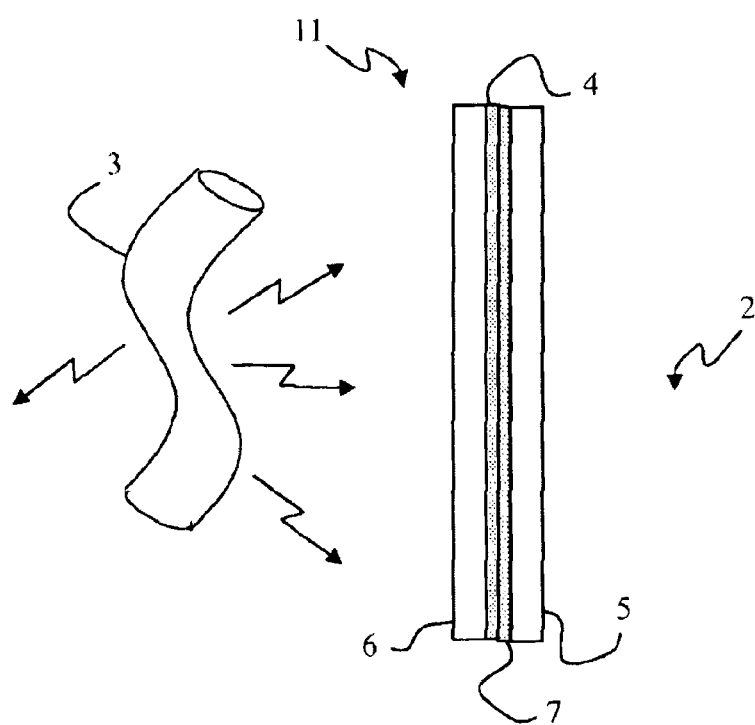
FIG. 2 is a schematic view of another device in accordance with the invention.

An optimum solution appears to be that of FIG. 2 wherein the device 11 comprises a second sheet 7 of ferromagnetic material, which sheet is spread between the first sheet 4 of ferromagnetic material and the first sheet 5 of electrically conductive material.

Figure 3:
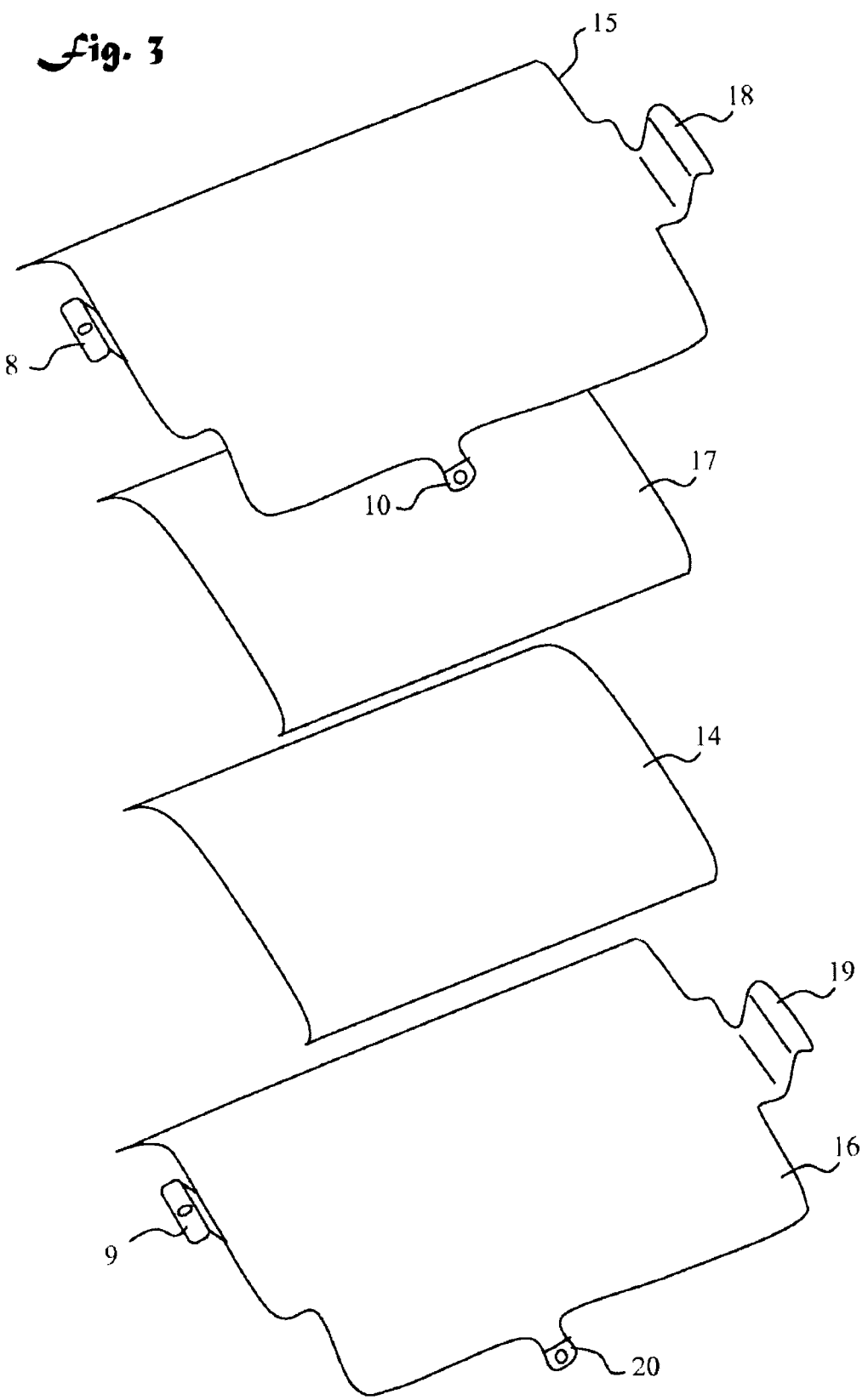
FIG. 3 is an exploded view of components shaped and combined in accordance with the method according to the invention.

FIG. 3 allows a method of manufacturing the device for protecting the space adjacent to the magnetic source against the magnetic energy radiated by the source to be explained.

A first step consists in shaping a first sheet 15 of diamagnetic or paramagnetic electrically conductive material. Shaping comprises actions of deforming, under a press, sheet metal, for example with a 1 mm thickness, comprising aluminum, or actions of molding a plate when the material is difficult to stamp. In order to be able to spread the sheet 15 with a first face opposite the space to be protected, lugs 8, 10 are cut, folded and/or machined, wherein holes are made which will allow the sheet to be fixed next to this space to be protected. A non-perforated tongue 18 can also be shaped with a view to a method of fixing by sticking or for any other function.

A second step consists in shaping a second sheet 16 of diamagnetic or paramagnetic electrically conductive material in a manner similar to that of the first step. In order to be able to spread the sheet 16 with a first face opposite the magnetic source, lugs 9, 20 are cut, folded and/or machined, which can be stacked against the lugs 8, 10 and wherein holes are made which will allow the sheet 16 to be fixed with the sheet 15. A non-perforated tongue 19 can also be shaped with a view to engaging the tongue 18.

A third step consists in spreading one or more, preferably two, sheets 14, 17 of ferromagnetic material over a second face of the first sheet 15 of electrically conductive material, which is opposite the first face of the first sheet 15. The surface area of each of the sheets 14, 17 is, preferably, less than that of each of the sheets 15, 16 of electrically conductive material in order to be able to be covered totally by the sheets 15, 16. In particular, since the sheets 14, 17 are only suitable for deforming by flection in one direction only, they are not placed in contact with the lugs 8, 9, 10, 20 in order to prevent them from breaking during bending which would be destructive.

A fourth step consists in positioning the second sheet 16 of electrically conductive material such that the sheet(s) 14, 17 of ferromagnetic material is(are) spread over a second face of the second sheet 16 of electrically conductive material, which is opposite the first face of the second sheet 16 of electrically conductive material.

The method that has just been described is that of one embodiment. A person skilled in the art will envisage various ways of modifying it without departing from the scope of the present invention. In particular, a person skilled in the art can remove the second and fourth steps when the latter prefers to make do with a single sheet of aluminum. The person skilled in the art can reverse the order of the steps, wherein the first two steps can equally be carried out one before the other or in parallel. Likewise, the fourth step can be carried out before the third step by positioning the sheets 14 and 17 on the sheet 16, then by positioning the sheet 15 on the stack obtained in this manner.

In summary, in the configuration disclosed, principally an additional sheet of FINEMET reduces the low cut-off frequency while the thickness of aluminum increases the attenuation.

The invention claimed is:

1. A device for protecting a space to be protected against magnetic energy radiated by a magnetic source, comprising:
   a first sheet of ferromagnetic material, the first sheet of ferromagnetic material being spread between the space to be protected and the magnetic source;
   a first sheet of diamagnetic or paramagnetic electrically conductive material, the first sheet of electrically conductive material being spread between the first sheet of ferromagnetic material and the space to be protected; and
   a second sheet of diamagnetic or paramagnetic electrically conductive material in direct contact with the first sheet of ferromagnetic material, the second sheet of electrically conductive material being spread between the first sheet of ferromagnetic material and the magnetic source, wherein the ferromagnetic material is an iron-based amorphous alloy having a non-orientated nanocrystalline structure.

2. The device as claimed in claim 1, further comprising:
a second sheet of ferromagnetic material, the second sheet of ferromagnetic material being spread between the first sheet of ferromagnetic material and the first sheet of electrically conductive material.

3. The device as claimed in claim 1, wherein the first sheet of electrically conductive material has a surface area which is greater than that of the first sheet of ferromagnetic material such as to completely cover the first sheet of ferromagnetic material.

4. The device as claimed in claim 1, wherein the ferromagnetic material has a relative magnetic permeability with a value greater than 100,000.

5. The device as claimed in claim 1, wherein the alloy comprises a chemical element of a group including silicon.

6. The device as claimed in claim 1, wherein the first sheet of ferromagnetic material is covered with at least one layer of electrically insulating material.

7. The device as claimed in claim 1, wherein the diamagnetic or paramagnetic electrically conductive material includes aluminum.

8. A mobile object comprising:
at least one electric member that is a source of magnetic radiation; and
the device as claimed in claim 1 to provide a low-mass protection against magnetic energy radiated by the source.

9. The mobile object as claimed in claim 8, which is a motor vehicle comprising a compartment that includes a space adjacent to the member, and wherein the device is placed between the member and the compartment.

10. The device as claimed in claim 1, further comprising:
a second sheet of ferromagnetic material, the second sheet of ferromagnetic material being spread between the first sheet of ferromagnetic material and the first sheet of electrically conductive material.

11. The device as claimed in claim 10, wherein the second sheet of ferromagnetic material is in direct contact with the first sheet of ferromagnetic material and the first sheet of electrically conductive material.

12. A method of manufacturing a device for protecting a space to be protected against magnetic energy radiated by a magnetic source, comprising:
shaping a first sheet of diamagnetic or paramagnetic electrically conductive material;
spreading, over the first sheet of diamagnetic or paramagnetic electrically conductive material, one or more first sheets of ferromagnetic material including an iron-based amorphous alloy having a non-oriented nanocrystalline structure;
shaping a second sheet of diamagnetic or paramagnetic electrically conductive material; and
positioning the second sheet of electrically conductive material in direct contact with one of the one or more first sheets of ferromagnetic material such that the second sheet of electrically conductive material is between the one or more first sheets of ferromagnetic material and the magnetic source.

* * * * *